United States Patent
Chen et al.

(10) Patent No.: US 12,369,496 B2
(45) Date of Patent: Jul. 22, 2025

(54) SEMICONDUCTOR DEVICE AND METHOD FOR FABRICATING THE SAME

(71) Applicant: UNITED MICROELECTRONICS CORP., Hsin-Chu (TW)

(72) Inventors: Wei Chen, Tainan (TW); Hui-Lin Wang, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 244 days.

(21) Appl. No.: 17/183,292

(22) Filed: Feb. 23, 2021

(65) Prior Publication Data

US 2022/0238793 A1 Jul. 28, 2022

(30) Foreign Application Priority Data

Jan. 26, 2021 (CN) .......................... 202110102212.0

(51) Int. Cl.
| | | |
|---|---|---|
| *H10N 50/10* | (2023.01) | |
| *H01F 10/32* | (2006.01) | |
| *H10B 61/00* | (2023.01) | |
| *H10N 50/01* | (2023.01) | |
| *H10N 50/85* | (2023.01) | |

(52) U.S. Cl.
CPC .......... *H10N 50/10* (2023.02); *H01F 10/3272* (2013.01); *H10B 61/00* (2023.02); *H10N 50/01* (2023.02); *H10N 50/85* (2023.02)

(58) Field of Classification Search
CPC ... H01L 27/222; H01L 43/10; H01F 10/3272; H10B 61/00; H10N 50/85
See application file for complete search history.

(56) References Cited

U.S. PATENT DOCUMENTS

| | | |
|---|---|---|
| 8,058,871 B2 | 11/2011 | Guo et al. |
| 9,203,017 B2 | 12/2015 | Apalkov et al. |
| 2013/0334631 A1* | 12/2013 | Kinney ............... G11C 11/1675 428/828 |
| 2014/0306302 A1* | 10/2014 | Jan ........................ H01L 43/08 257/421 |
| 2017/0294482 A1* | 10/2017 | Hu ........................ H10B 61/20 |
| 2019/0165258 A1* | 5/2019 | Peng ..................... H10N 50/01 |
| 2020/0098409 A1* | 3/2020 | Li ........................ G11C 11/1657 |
| 2020/0185595 A1 | 6/2020 | Le et al. |
| 2021/0175284 A1* | 6/2021 | Ouellette ............. H01F 41/303 |
| 2021/0217811 A1* | 7/2021 | Min ........................ H10N 50/80 |
| 2021/0384415 A1* | 12/2021 | Sun ........................ H01L 43/12 |

OTHER PUBLICATIONS

Samuel J. Ling et al., University Physics vol. 2, Rice University, 2018, pp. 560-566 (Year: 2018).*

* cited by examiner

*Primary Examiner* — Shih Tsun A Chou
(74) *Attorney, Agent, or Firm* — Winston Hsu

(57) ABSTRACT

A semiconductor device includes a synthetic antiferromagnetic (SAF) layer on a substrate, a barrier layer on the SAF layer, and a free layer on the barrier layer. Preferably, the SAF layer further includes a first pinned layer, a first spacer on the first pinned layer, a second pinned layer on the first spacer, a second spacer on the second pinned layer, and a reference layer on the second spacer.

3 Claims, 4 Drawing Sheets

SEMICONDUCTOR DEVICE AND METHOD FOR FABRICATING THE SAME

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating a semiconductor device includes first conducting step (a) of forming a first pinned layer on a substrate, conducting step (b) of forming a first spacer on the first pinned layer, and then repeating the steps (a) and (b). Specifically, the method further includes forming a second pinned layer on the first spacer, forming a second spacer on the second pinned layer, forming a third pinned layer on the second spacer, forming a third spacer on the third pinned layer, forming a reference layer on the third spacer, forming a barrier layer on the reference layer, and forming a free layer on the barrier layer.

A semiconductor device includes a synthetic antiferromagnetic (SAF) layer on a substrate, a barrier layer on the SAF layer, and a free layer on the barrier layer. Preferably, the SAF layer further includes a first pinned layer, a first spacer on the first pinned layer, a second pinned layer on the first spacer, a second spacer on the second pinned layer, and a reference layer on the second spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
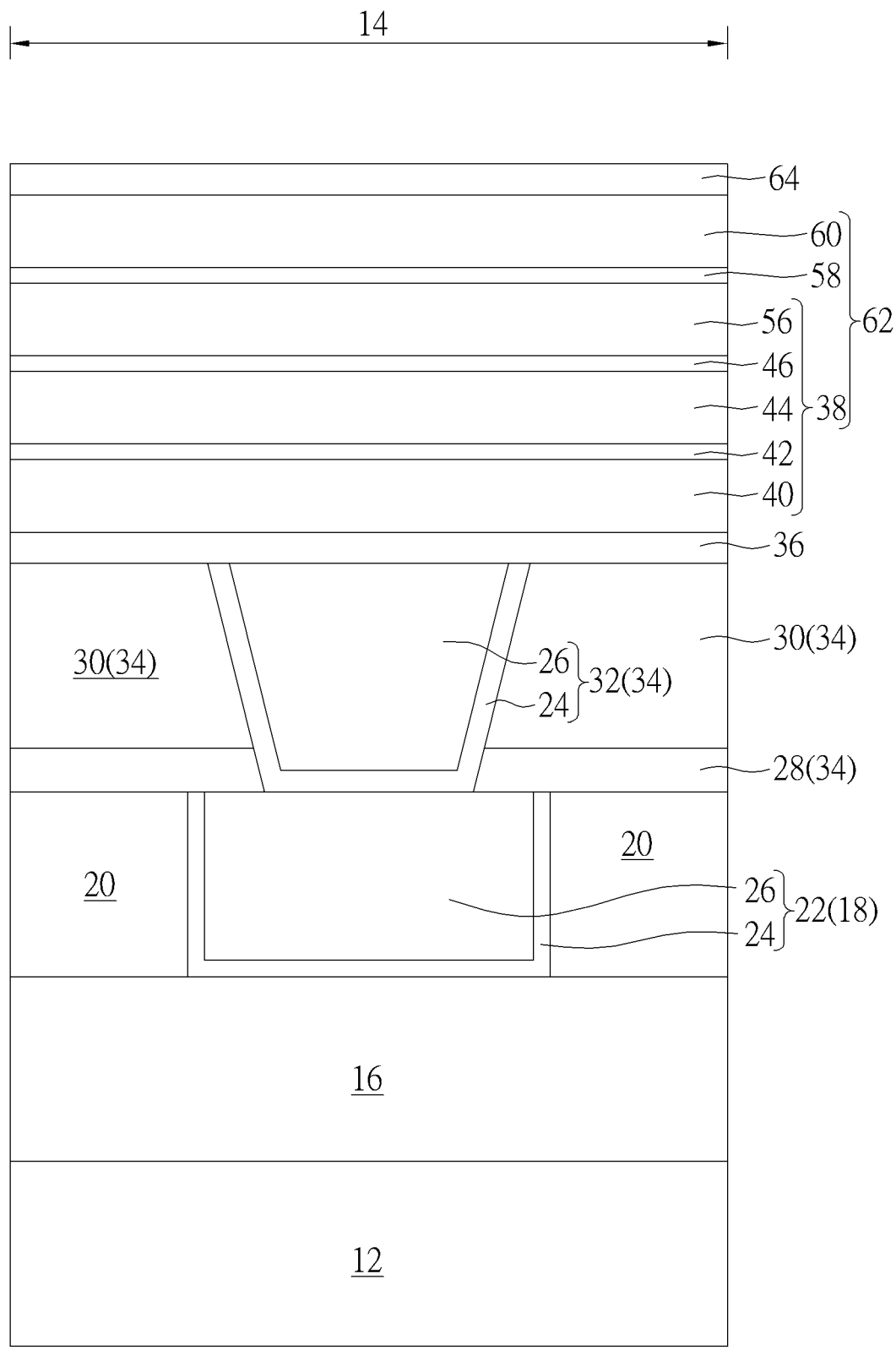
FIGS. 1-3 illustrate a method for fabricating a MRAM device according to an embodiment of the present invention.
Figure 2:
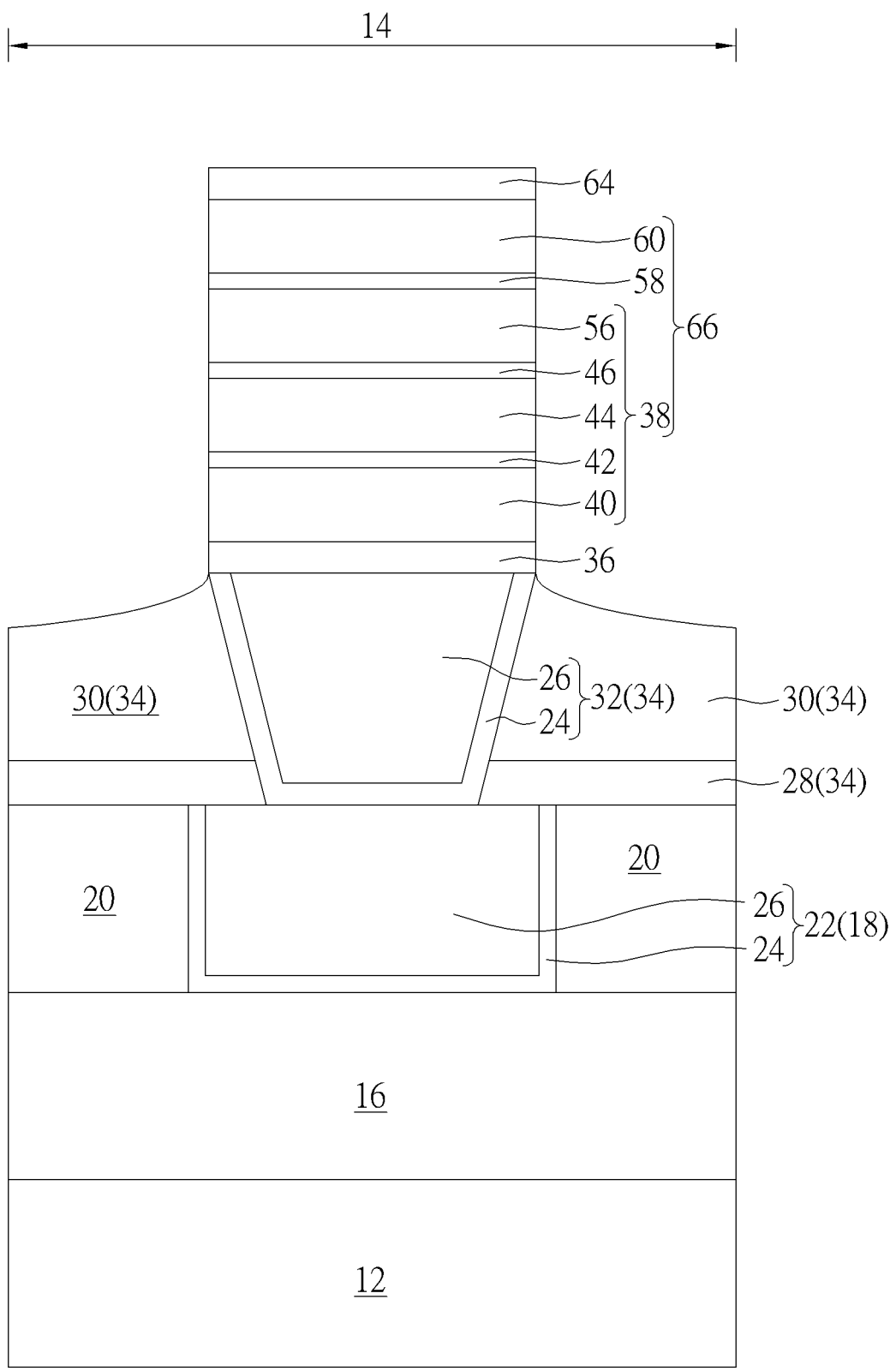
Figure 3:
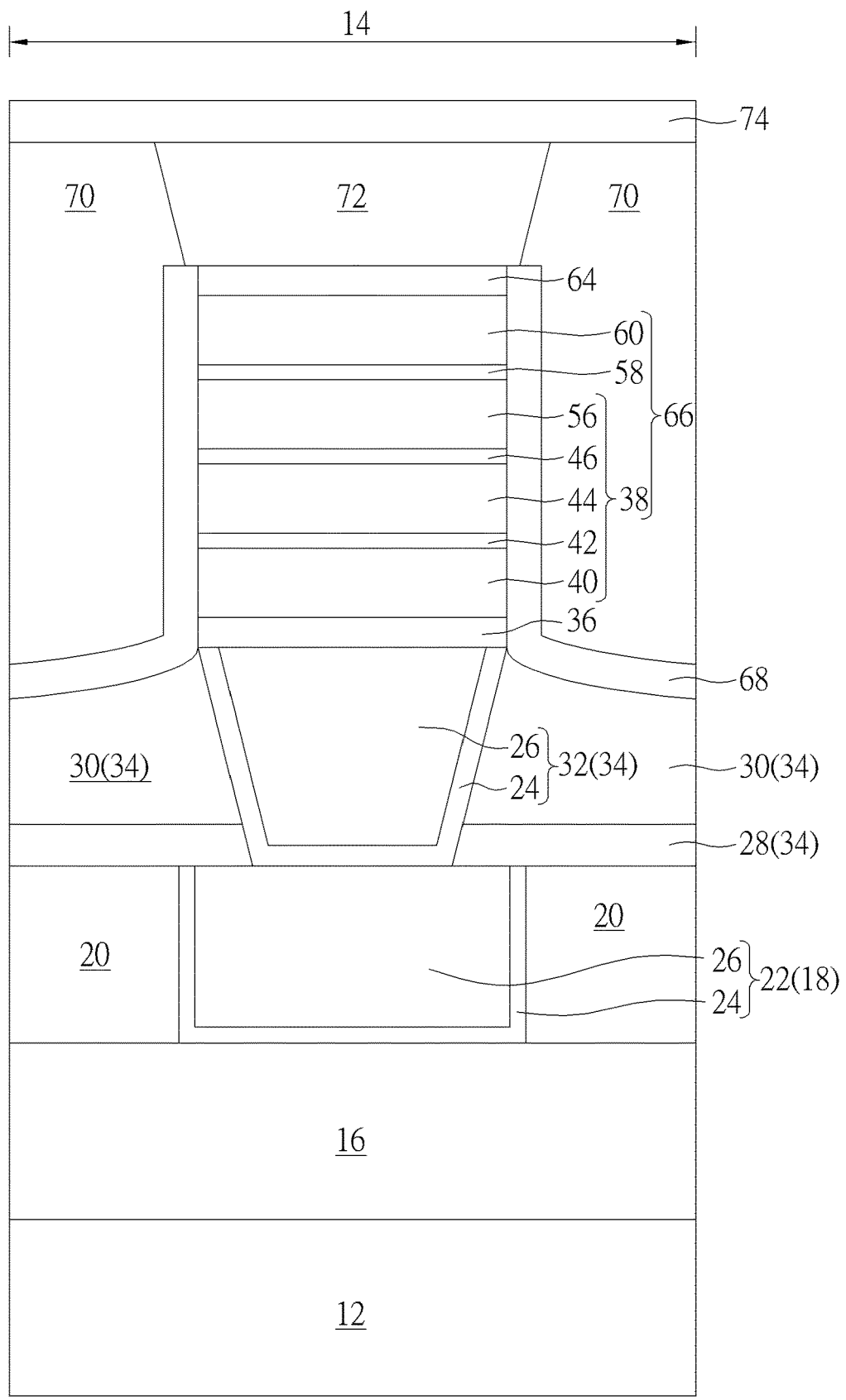

Referring to FIGS. 1-3, FIGS. 1-3 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, a metal interconnect structures 18, 34 are formed on the ILD layer 16 to electrically connect the aforementioned contact plugs, in which the metal interconnect structure 18 includes an inter-metal dielectric (IMD) layer 20 and at least a metal interconnection 22 embedded in the IMD layer 20 and the metal interconnect structure 34 includes a stop layer 28, an IMD layer 30, and at least a metal interconnection 32 embedded in the stop layer 28 and the IMD layer 30.

In this embodiment, the metal interconnection 22 from the metal interconnect structure 18 preferably includes a trench conductor and the metal interconnection 32 directly under MTJ which will be formed afterwards includes a via conductor. Each of the metal interconnections 22 from the metal interconnect structure 18 and each of the metal interconnections 32 from the metal interconnect structure 34 could be embedded within the IMD layers 20, 30 and/or stop layer 28 according to a single damascene process or dual damascene process and electrically connected to each other. For instance, each of the metal interconnections 22, 32 could further include a barrier layer 24 and a metal layer 26, in which the barrier layer 24 could be selected from the group consisting of titanium (Ti), titanium nitride (TiN), tantalum (Ta), and tantalum nitride (TaN) and the metal layer 26 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 26 in the metal interconnection 22 is preferably made of copper, the metal layer 26 in the metal interconnection 32 is preferably made of tungsten, the IMD layers 20, 30 are made of silicon oxide such as tetraethyl orthosilicate (TEOS), and the stop layer 28 could include nitrogen doped carbide (NDC), silicon nitride, silicon carbon nitride (SiCN), or combination thereof.

Next, a bottom electrode 36 is formed on the surface of the IMD layer 30 and metal interconnection 32, and a MTJ stack 62 made of a synthetic antiferromagnetic (SAF) layer 38, a barrier layer 58, and a free layer 60 is formed on the bottom electrode 36, and a top electrode 64 is formed on the MTJ stack 62 thereafter. In this embodiment, the formation of the SAF layer 38 could be accomplished by first conducting a step (a) of forming a first pinned layer 40 on the substrate 12 or bottom electrode 36, conducting a step (b) of forming a spacer 42 on the pinned layer 40, and then repeating steps (a) and (b) such as forming another pinned layer 44 and another spacer 46 on the spacer 42, and then forming a reference layer 56 on the topmost spacer 46. In other words, the SAF layer 38 formed by the above approach is constituted by a plurality of pinned layers 40, 44 and spacers 42, 46 alternately stacked over one another and a reference layer 56 formed on the surface of the topmost spacer 46. In the MRAM unit of this embodiment, the SAF layer 38 preferably includes two layers pinned layers 40, 44 and two layers spacers 42, 46 alternately disposed over one another and a single reference layer 56 disposed on the surface of the topmost spacer 46, in which the pinned layer 40 is disposed on the surface of the bottom electrode 34, the spacer 42 is disposed on the surface of the pinned layer 40, the pinned layer 44 is disposed on the surface of the spacer 42, the spacer 46 is disposed on the surface of the pinned layer 44, and the reference layer 56 is disposed on the surface of the spacer 46.

In this embodiment, each of the pinned layers 40, 44 could be made of same or different ferromagnetic materials and the pinned layers 40, 44 and the reference layer 56 could also be made of same or different ferromagnetic materials. For instance, the pinned layers 40, 44 could be selected from the group consisting of cobalt and platinum, the pinned layers 40, 44 could be selected from the group consisting of cobalt and palladium, the pinned layers 40, 44 could be selected from the group consisting of cobalt and iridium, and the pinned layers 40, 44 could be selected from the group consisting of cobalt and nickel. The spacers 42, 46 on the other hand could be selected from the group consisting of ruthenium, iridium, and rhodium.

Typically, antiferromagnetic field generated by the SAF layer 38 could be used to balance the stray field of the MTJ so that reduction of exchange coupling between reference layer and pinned layer could be prevented and magnetic performance of the device could be maintained. Nevertheless, conventional SAF layer only includes or relies on a single pinned layer, a single spacer, and a single reference for generating antiferromagnetic (AFM) coupling effect and insufficient coupling generated by such design often induces the reference layer to generate a large quantity of flipping pulses affecting the performance of the device. To resolve this issue the present invention preferably forms a SAF layer made by alternately stacking more than one set of pinned layers and spacers on the bottom electrode and a reference layer on the topmost spacer, in which the sandwich structures each formed by a spacer and pinned layers and/or reference layer above or below the spacer could be used to generate AFM coupling effects. For instance, the pinned layer 40, the spacer 42, and the pinned layer 44 together could be used to generate an AFM coupling effect, the pinned layer 44, the spacer 46, and the reference layer 56 together could be used to generate another AFM coupling effect. By using multiple AFM couplings generated by the above alternating stack structure to further generate dipolar coupling effect, stability of the reference layer could be improved significantly and flipping pulse issue caused by insufficient AFM coupling could be prevented.

In this embodiment, the bottom electrode 36 and the top electrode 64 are preferably made of conductive material including but not limited to for example Ta, Pt, Cu, Au, Al, or combination thereof. The reference layer 56 disposed between the spacer 46 and the barrier layer 58 could be made of ferromagnetic material including but not limited to for example iron, cobalt, nickel, or alloys thereof such as cobalt-iron-boron (CoFeB). The barrier layer 58 could be made of insulating material including but not limited to for example oxides such as aluminum oxide ($AlO_x$) or magnesium oxide (MgO). The free layer 60 including a first free layer and a second free layer could be made of ferromagnetic material including but not limited to for example iron, cobalt, nickel, or alloys thereof such as cobalt-iron-boron (CoFeB) or nickel-iron (NiFe), in which the magnetized direction of the free layer 60 could be altered freely depending on the influence of outside magnetic field.

Next, as shown in FIG. 2, one or more etching process is conducted by using a patterned hard mask (not shown) as mask (not shown) to remove part of the top electrode 64, part of the MTJ stack 62, part of the bottom electrode 36, and part of the IMD layer 30 for forming a MTJ 66 on the metal interconnection 32. It should be noted that a reactive ion etching (RIE) process and/or an ion beam etching (IBE) process could be conducted to remove the MTJ stack 62 and IMD layer 30 during the patterning process and due to the characteristics of the IBE process, the top surface of the remaining IMD layer 30 could be slightly lower than the top surface of the metal interconnections 32 after the IBE process and the top surface of the IMD layer 30 also reveals a curve or an arc.

Next, as shown in FIG. 3, a cap layer 68 is formed on the MTJ 66 to cover the surface of the IMD layer 30, an IMD layer 70 is formed on the cap layer 68, and one or more photo-etching process is conducted to remove part of the IMD layer 70 and part of the cap layer 68 to form a contact hole (not shown) exposing the top electrode 64. Next, conductive materials are deposited into the contact hole and planarizing process such as CMP is conducted to form a metal interconnection 72 connecting the top electrodes 64 underneath. Next, another stop layer 74 is formed on the IMD layer 70 and covering the metal interconnections 72.

In this embodiment, the cap layer 68 preferably includes silicon nitride, but could also include other dielectric material including but not limited to for example silicon oxide, silicon oxynitride (SiON), or SiCN depending on the demand of the product. The stop layer 74 could include nitrogen doped carbide (NDC), silicon nitride, silicon carbon nitride (SiCN), and most preferably SiCN. Similar to the aforementioned metal interconnection 22, the metal interconnections 72 could be formed in the IMD layer 70 according to a single damascene process or dual damascene process. For instance, the metal interconnection 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Figure 4:
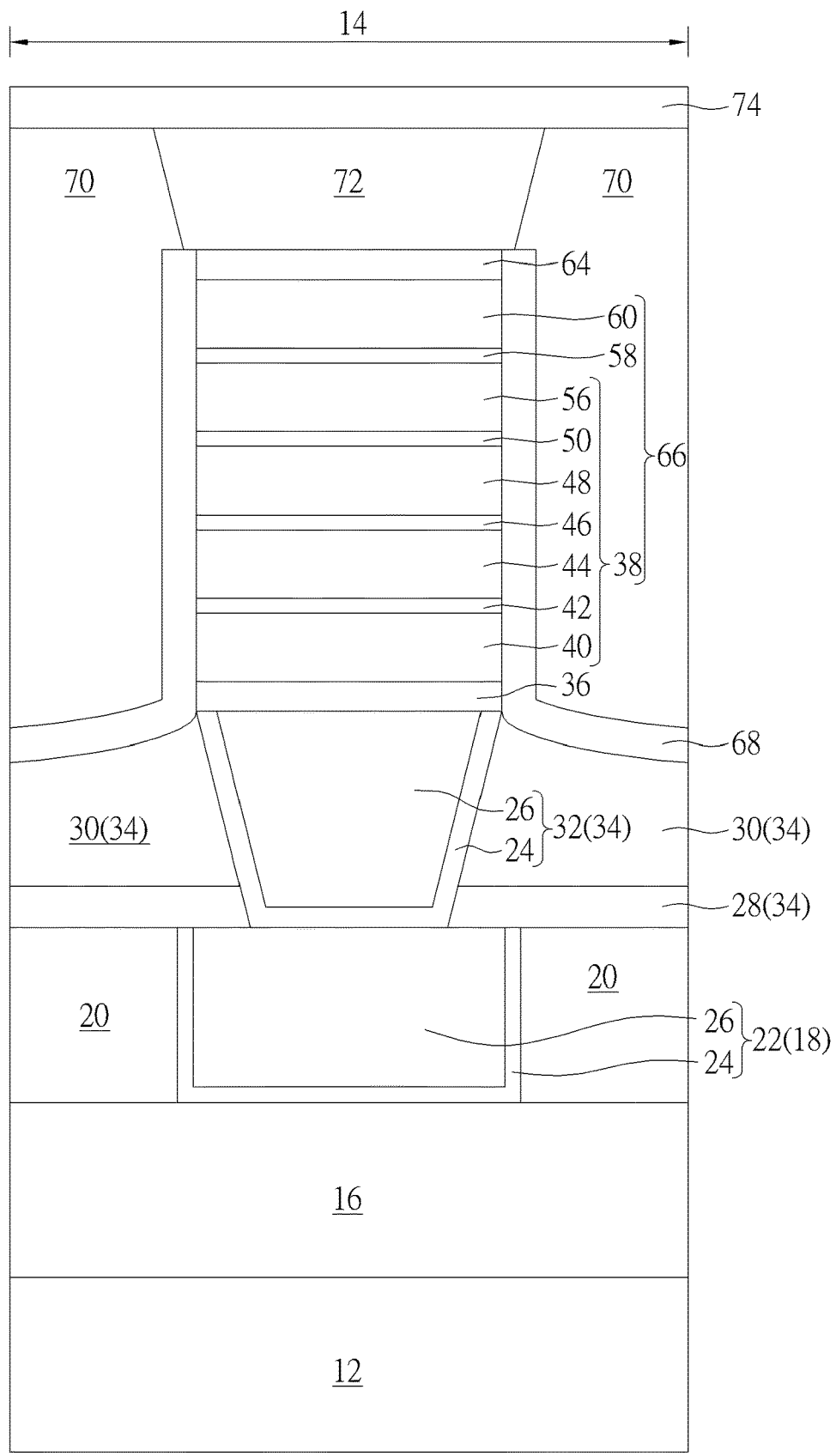
FIG. 4 illustrates a structural view of a MRAM device according to an embodiment of the present invention.

Referring to FIG. 4, FIG. 4 illustrates a structural view of a MRAM device according to an embodiment of the present invention. As shown in FIG. 4, in contrast to the aforementioned embodiment of forming two sets of alternately stacked pinned layers 40, 44 and spacers 42, 46, it would also be desirable to adjust the number of pinned layers and spacers according to the demand of the product such as by forming three sets of alternately stacked pinned layers 40, 44, 48 and spacers 42, 46, 50 and a reference layer 56 on top surface of the spacer 50 for forming the SAF layer 38, which is also within the scope of the present invention.

Overall, to resolve the issue of insufficient AFM coupling generated by the SAF layer thereby inducing reference layer to produce flipping pulse and affect performance of the device in conventional art, the present invention preferably forms a SAF layer made by alternately stacking more than one set of pinned layers and spacers on the bottom electrode and a reference layer on the topmost spacer, in which the sandwich structures each formed by a spacer and pinned layers and/or reference layer above or below the spacer could be used for generating AFM coupling effects. For instance, the pinned layer 40, the spacer 42, and the pinned layer 44 together could be used to generate an AFM coupling effect, and the pinned layer 44, the spacer 46, and the reference layer 56 together could be used to generate another AFM coupling effect. By using multiple AFM couplings generated by the above alternating stack structure to further generate dipolar coupling effect, stability of the reference layer could be improved significantly and flipping pulse issue caused by insufficient AFM coupling could be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a bottom electrode and a synthetic antiferromagnetic (SAF) layer on a substrate, wherein the SAF layer comprises:
        a first pinned layer, wherein the first pinned layer is selected from the group consisting of cobalt and platinum;
        a first spacer on the first pinned layer;
        a second pinned layer on the first spacer, wherein the second pinned layer is selected from the group consisting of cobalt and palladium;
        a second spacer on the second pinned layer;
        a third pinned layer on the second spacer;
        a third spacer on the third pinned layer; and
        a reference layer on and directly contacting the third spacer, wherein the first pinned layer and the second pinned layer are made of same material while the first pinned layer and the reference layer are made of different materials, the reference layer comprises CoFeB, the first pinned layer, the first spacer, and the second pinned layer together generate a first antiferromagnetic (AFM) coupling effect, the second pinned layer, the second spacer, and the third pinned layer together generate a second AFM coupling effect, and the third pinned layer, the third spacer, and the reference layer together generate a third AFM coupling effect;
    a barrier layer on the reference layer;
    a free layer on the barrier layer;
    a top electrode on the free layer;
    a cap layer on sidewalls of the bottom electrode, the first pinned layer, the first spacer, the second pinned layer, the second spacer, the third pinned layer, the third spacer, the reference layer, the barrier layer, the free layer, and the top electrode;
    a first metal interconnection located under the bottom electrode and directly contacting the bottom electrode;
    a first inter-metal dielectric (IMD) layer around the first metal inter connection, wherein the first IMD layer comprises a curve top surface lower than a top surface of the first metal interconnection, and the cap layer is disposed on and directly contacts the curve top surface of the first IMD layer;
    a second IMD layer around the cap layer; and
    a second metal interconnection in the second IMD layer and directly contacting the top electrode, wherein a part of the second metal interconnection is disposed above and directly contacts the cap layer.

2. The semiconductor device of claim 1, wherein the first spacer is selected from the group consisting of ruthenium, iridium, and rhodium.

3. The semiconductor device of claim 1, wherein the cap layer is conformally disposed on the curve top surface of the first IMD layer and the sidewalls of the bottom electrode, the first pinned layer, the first spacer, the second pinned layer, the second spacer, the third pinned layer, the third spacer, the reference layer, the barrier layer, the free layer, and the top electrode.

* * * * *